United States Patent
Won et al.

(10) Patent No.: US 7,554,146 B2
(45) Date of Patent: Jun. 30, 2009

(54) METAL-INSULATOR-METAL CAPACITOR AND METHOD OF FABRICATING THE SAME

(75) Inventors: Seok-jun Won, Seoul (KR); Dae-jin Kwon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 363 days.

(21) Appl. No.: 11/317,859

(22) Filed: Dec. 23, 2005

(65) Prior Publication Data

US 2006/0157766 A1     Jul. 20, 2006

(30) Foreign Application Priority Data

Dec. 27, 2004    (KR)    ....................... 10-2004-0113210

(51) Int. Cl.
*H01L 29/94*     (2006.01)
(52) U.S. Cl. ...................... 257/296; 257/533; 257/596; 257/E27.016; 257/E27.019; 257/E27.023; 257/313
(58) Field of Classification Search ................. 257/296, 257/533, 595, E27.016, E27.023, E27.019, 257/313
See application file for complete search history.

(56) References Cited

U.S. PATENT DOCUMENTS

2004/0135186 A1*   7/2004   Yamamoto ................. 257/296

2005/0006771 A1*   1/2005   Akiyama ................... 257/758

FOREIGN PATENT DOCUMENTS

KR    10-2004-0011245     2/2004
KR    10-20040032333     4/2004

* cited by examiner

*Primary Examiner*—Wai-Sing Louie
*Assistant Examiner*—Marc Armand
(74) *Attorney, Agent, or Firm*—Mills & Onello, LLP

(57) ABSTRACT

In a metal-insulator-metal (MIM) capacitor and a method of fabricating the MIM capacitor, a metal-insulator-metal (MIM) capacitor comprises: a lower electrode pattern which is formed on a substrate and includes a conductive layer having a portion as a lower interconnect; a dielectric layer on the lower electrode pattern; a first upper electrode pattern on the dielectric layer; an interlayer insulating layer which covers the first upper electrode pattern, the dielectric layer, and the lower electrode pattern and has a planarized upper surface; a second upper electrode opening pattern formed in the interlayer insulating layer to expose the first upper electrode pattern; a second upper electrode which fills the opening pattern and has an upper surface that is substantially level with an upper surface of the interlayer insulating layer; and an upper interconnect on the interlayer insulating layer and contacts the second upper electrode.

3 Claims, 11 Drawing Sheets

METAL-INSULATOR-METAL CAPACITOR AND METHOD OF FABRICATING THE SAME

This application claims priority from Korean Patent Application No. 10-2004-0113210 filed on Dec. 27, 2004, in the Korean Intellectual Property Office, the disclosure of which is incorporated herein by reference in its entirety.

BACKGROUND OF THE INVENTION

1. Field of the Invention

The present invention relates to a metal-insulator-metal (MIM) capacitor and a method of fabricating the same, and more particularly, to an MIM capacitor capable of preventing the generation of a crack around the edges of a dielectric layer and a method of fabricating the MIM capacitor.

2. Description of the Related Art

Semiconductor devices in BIPOLAR, BICMOS and CMOS technology require integrated capacitors having high voltage linearity, accurately settable capacitance values, and low parasitic capacitance values. Conventional MOS or MIS capacitors commonly employed in contemporary systems not only have unsatisfactory voltage linearity that arises from voltage-induced space charge regions but also numerous sources of parasitic capacitance.

To avoid theses difficulties, polysilicon-insulator-polysilicon (PIP) capacitors have recently become popular. However, since the PIP capacitors use conductive polysilicon for an upper electrode layer and a lower electrode layer, an oxidation reaction occurs in the interfaces between upper and lower electrodes and a dielectric layer, resulting in the formation of a natural oxide film and thus reduction of the overall capacitance value.

One approach to solving this problem is to use metal-insulator-metal (MIM) capacitors that are primarily used for storing charge in various semiconductor devices such as mixed-signal devices and analog devices.

FIG. 1 is a cross sectional view of a conventional metal-insulator-metal (MIM) capacitor. As shown in FIG. 1, a conventional MIM capacitor 10 includes a lower electrode layer 100, a dielectric layer 110, an upper electrode pattern 150 including a first upper electrode pattern 120 and a second upper electrode pattern 130, and an upper interconnect 180. The dielectric layer 110 is formed in an opening 107 of an interlayer insulating layer 130, on the lower electrode layer 100 and has sidewalls, and a bottom of the dielectric layer 110 is in contact with the lower electrode layer 100. The upper electrode pattern 150 is conformally formed on the dielectric layer 110. The interlayer insulating layer 105 covers the entire surface of the resulting structure formed on the lower electrode layer 100 and upper surfaces of the sidewalls of the dielectric layer 110 and an upper surface of the upper electrode layer 120 remain exposed. The upper interconnect 180 is conformally formed on the upper electrode pattern 150 and the interlayer insulating layer 105.

In this case, the upper electrode pattern 150 includes the first upper electrode pattern 120 made of TiN and the second upper electrode pattern 130 made of tungsten (W). The upper interconnect 180 is made of aluminum (Al).

In the case of the MIM capacitor illustrated in FIG. 1, since the entire thickness of the upper electrode pattern 150 formed within the opening 107 formed within the interlayer insulating layer 105 is thinner than that of the interlayer insulating layer 105, a part of the opening 107 is filled with the upper electrode pattern 150, and the remainder of the opening 107 is filled with the upper interconnect 180. In other words, Al forming the upper interconnect 180 and the second upper electrode pattern 130 of the upper electrode pattern 150 coexist within the opening 107. However, Al forming the upper interconnect 180 and W forming the second upper electrode pattern 130 have different coefficients of thermal expansion, and thus, stress is concentrated around the edges 155 of the second upper electrode pattern 130, which are bent into an "L"-shape since Al forming the upper interconnect 180 swells in the subsequent thermal treatment process after forming the upper interconnect 180. As a result, cracks can be generated in the dielectric layer 110 that contacts the edges 155 of the upper electrode pattern 150, thereby lowering the overall manufacturing yield of MIM capacitors.

SUMMARY OF THE INVENTION

The present invention provides a metal-insulator-metal (MIM) capacitor capable of preventing the generation of a crack in a dielectric layer under an upper electrode pattern.

The present invention also provides a method of fabricating the MIM capacitor.

The above stated objects as well as other objects, features and advantages, of the present invention will become clear to those skilled in the art upon review of the following description of embodiments of the invention.

In one aspect, the present invention is directed to a metal-insulator-metal (MIM) capacitor comprising: a lower electrode pattern which is formed on a substrate and includes a conductive layer having a portion as a lower interconnect; a dielectric layer on the lower electrode pattern; a first upper electrode pattern on the dielectric layer; an interlayer insulating layer which covers the first upper electrode pattern, the dielectric layer, and the lower electrode pattern and has a planarized upper surface; a second upper electrode opening pattern formed in the interlayer insulating layer to expose the first upper electrode pattern; a second upper electrode which fills the opening pattern and has an upper surface that is substantially level with an upper surface of the interlayer insulating layer; and an upper interconnect on the interlayer insulating layer and contacts the second upper electrode.

In one embodiment, the second upper electrode opening pattern exposes a portion of, or the entire, first upper electrode pattern.

In another embodiment, the first upper electrode pattern comprises a Ti or TiN layer.

In another embodiment, the second upper electrode comprises: a barrier layer which is conformally formed along inner sidewalls and a bottom of the second upper electrode opening pattern; and a conductive layer which is formed on the barrier layer to fill the second upper electrode opening pattern.

In another embodiment, the barrier layer comprises a single layer of Ti or TiN or a double layer of Ti and TiN layers and the conductive layer comprises tungsten (W).

In another aspect, the present invention is directed to a metal-insulator-metal (MIM) capacitor comprising: a lower electrode pattern which is formed on a substrate and includes a conductive layer having a portion as a lower interconnect; a first interlayer insulating layer on the lower electrode pattern and which has a planarized upper surface; an opening pattern in the first interlayer insulating layer that exposes the lower electrode pattern; a dielectric layer conformally formed in the opening pattern along inner sidewalls and a bottom of the opening pattern; an upper electrode filling the opening pattern, an upper surface of which is substantially level with an upper surface of the first interlayer insulating layer; a second interlayer insulating layer on the first interlayer insulating layer and having a planarized upper surface; a via in the second interlayer insulating layer and contacting the upper electrode; and an upper interconnect on the second interlayer insulating layer that contacts the via.

In one embodiment, the upper electrode comprises: a first conductive layer which is conformally formed on the dielectric layer; and a second conductive layer on the first conductive layer and filling the opening pattern.

In another embodiment, the first conductive layer comprises a TiN layer and the second conductive layer comprises tungsten.

In another embodiment, the via comprises: a barrier layer which is conformally formed in the second interlayer insulating layer on inner sidewalls and a bottom of a via hole that exposes the upper electrode; and a conductive layer which is formed on the barrier layer, covers the via hole, and has an upper surface that is substantially level with the second interlayer insulating layer.

In another embodiment, the barrier layer comprises a double layer of Ti and TiN layers and the conductive layer comprises tungsten (W).

In another embodiment, the via comprises multiple vias.

In another aspect, the present invention is directed to a metal-insulator-metal (MIM) capacitor comprising: a lower electrode pattern which is formed on a substrate and includes a conductive pattern having a portion as a lower interconnect; a first interlayer insulating layer on the lower electrode pattern and which has a planarized upper surface; an opening pattern in the first interlayer insulating layer and which exposes the lower electrode pattern; a dielectric layer conformally formed in the opening pattern along inner sidewalls and a bottom of the opening pattern; an upper electrode filling the opening pattern on the dielectric layer; a filling insulating layer on the upper electrode and filling the opening pattern; a second interlayer insulating layer on the first interlayer insulating layer and having a planarized upper surface; a via in the second interlayer insulating layer and the filling insulating layer and contacting the upper electrode; and an upper interconnect on the second interlayer insulating layer that contacts the via.

In one embodiment, the upper electrode comprises: a first conductive layer which is conformally formed on the dielectric layer; and a second conductive layer on the first conductive layer and filling the opening pattern.

In another embodiment, the via comprises: a barrier layer which is conformally formed in the second interlayer insulating layer on sidewalls and a bottom of a via hole that exposes the upper electrode; and a conductive layer which is on the barrier layer, covers the via hole, and has an upper surface that is substantially level with the second interlayer insulating layer.

In another embodiment, the first and second conductive layers of the upper electrode comprise a TiN layer and a tungsten (W) layer, respectively, and the barrier layer and the conductive layer of the via comprise a Ti/TiN layer and a tungsten (W) layer, respectively.

In another embodiment, the via comprises multiple vias.

In another aspect, the present invention is directed to a method of fabricating a metal-insulator-metal (MIM) capacitor, the method comprising: sequentially forming a dielectric layer and a first upper electrode layer on a lower electrode pattern that is formed on a substrate and includes a conductive layer having a portion as a lower interconnect; forming a first upper electrode pattern by patterning a portion of the first upper electrode layer using an etching process; forming an interlayer insulating layer that covers the first upper electrode pattern and the exposed dielectric layer and has a planarized upper surface; forming a second upper electrode opening pattern that exposes the first upper electrode pattern in the interlayer insulating layer; forming a second upper electrode having an upper surface that is substantially level with an upper surface of the interlayer insulating layer by filling the opening pattern; and forming an upper interconnect that contacts the second upper electrode on the interlayer insulating layer.

In one embodiment, in the forming of the second upper electrode opening pattern, the first upper electrode pattern is partially or entirely exposed.

In another embodiment, the first upper electrode pattern comprises a Ti or TiN layer.

In another embodiment, the forming of the second upper electrode comprises: forming a barrier layer conformally along inner sidewalls and a bottom of the second upper electrode opening pattern; and forming a conductive layer on the barrier layer to fill the second upper electrode opening pattern.

In another embodiment, in the forming of the second upper electrode, the barrier layer is formed of a double layer of Ti and TiN layers and the conductive layer is formed of a single layer comprising tungsten (W).

In another aspect, the present invention is directed to a method of fabricating a metal-insulator-metal (MIM) capacitor, the method comprising: forming a first interlayer insulating layer that has a planarized upper surface on an upper electrode pattern that is formed on a substrate and includes a conductive layer having a portion as a lower interconnect; forming an opening pattern that exposes the lower electrode pattern in the first interlayer insulating layer; conformally forming a dielectric layer in the opening pattern along inner sidewalls and a bottom of the opening pattern; forming an upper electrode having an upper surface that is substantially level with an upper surface of the first interlayer insulating layer by filling the opening pattern; forming a second interlayer insulating layer having a planarized upper surface on the first interlayer insulating layer; forming a via that contacts the upper electrode in the second interlayer insulating layer; and forming an upper interconnect that contacts the via on the second interlayer insulating layer.

In one embodiment, the forming of the upper electrode comprises: forming a first conductive layer conformally on the dielectric layer along inner sidewalls and a bottom of the dielectric layer; and forming a second conductive layer on the first conductive layer to fill the opening pattern.

In another embodiment, in the forming of the upper electrode, the first conductive layer is formed of TiN and the second conductive layer is formed of tungsten (W).

In another embodiment, the forming of the via comprises: forming a barrier layer conformally along inner sidewalls and a bottom of the via hole; and forming a conductive layer on the barrier layer to fill the via hole so that an upper surface of the conductive layer is substantially level with respect to the second interlayer insulating layer.

In another embodiment, in the forming of the via, the barrier layer is formed of a double layer of Ti and TiN layers and the conductive layer is formed of a single layer made of tungsten (W).

In another embodiment, forming the via comprises forming multiple vias.

In another aspect, the present invention is directed to a method of fabricating a metal-insulator-metal (MIM) capacitor, the method comprising: forming a first interlayer insulating layer that has a planarized upper surface on an upper electrode pattern that is formed on a substrate and includes a conductive layer having a portion as a lower interconnect; forming an opening pattern that exposes the lower electrode pattern in the first interlayer insulating layer; conformally forming a dielectric layer in the opening pattern along inner sidewalls and a bottom of the opening pattern; conformally forming an upper electrode on the dielectric layer; forming a filling insulating layer having an upper surface that is substantially level with an upper surface of the first interlayer insulating layer by filling the opening pattern; forming a second interlayer insulating layer having a planarized upper surface on the first interlayer insulating layer; forming a via that contacts the upper electrode in the second interlayer insulating layer and the filling insulating layer; and forming an upper interconnect that contacts the via on the second interlayer insulating layer.

In one embodiment, the forming of the upper electrode comprises: forming a first conductive layer conformally on the dielectric layer along inner sidewalls and a bottom of the dielectric layer; and forming a second conductive layer on the first conductive layer to fill the opening pattern.

In another embodiment, in the forming of the upper electrode, the first conductive layer is formed of TiN and the second conductive layer is formed of tungsten (W).

In another embodiment, the forming of the via comprises: forming a barrier layer conformally along inner sidewalls and a bottom of the via hole; and forming a conductive layer on the barrier layer to fill the via hole so that an upper surface of the conductive layer is substantially level with respect to the second interlayer insulating layer.

In another embodiment, in the forming of the via, the barrier layer is formed of a double layer of Ti and TiN layers and the conductive layer is formed of a single layer made of tungsten (W).

In another embodiment, forming the via comprises forming multiple vias.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1:
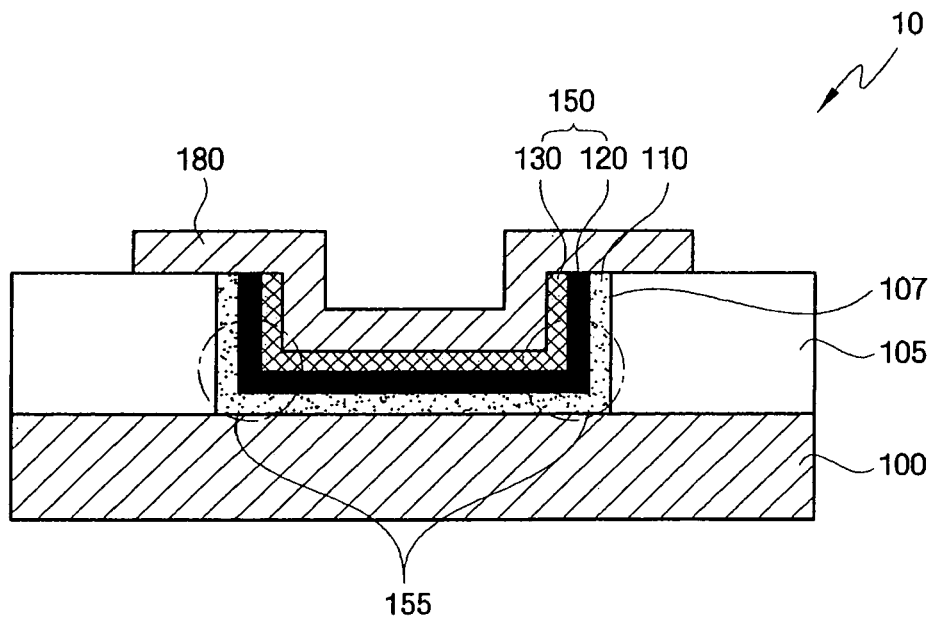
FIG. 1 is a cross sectional view of a conventional metal-insulator-metal (MIM) capacitor.

The present invention will now be described more fully hereinafter with reference to the accompanying drawings, in which preferred embodiments of the invention are shown. This invention may, however, be embodied in different forms and should not be construed as limited to the embodiments set forth herein.

In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout the specification.

Figure 2:
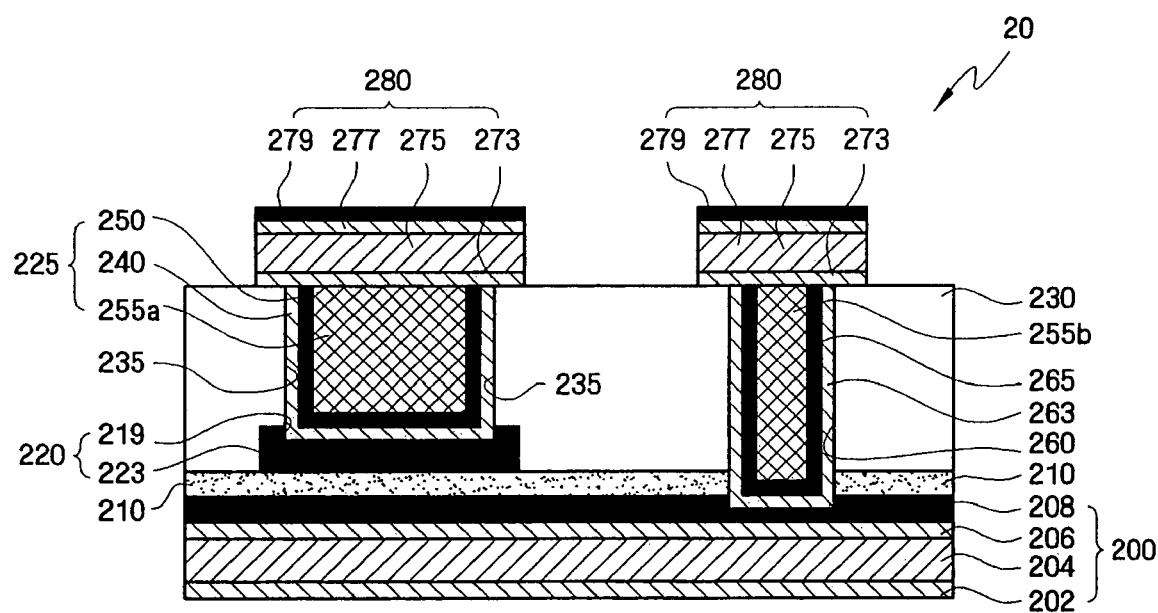
FIG. 2 is a cross sectional view of an MIM capacitor according to a first embodiment of the present invention.

FIG. 2 is a cross sectional view of an MIM capacitor 20 according to a first embodiment of the present invention.

Referring to FIG. 2, the MIM capacitor 20 includes a lower electrode pattern 200, a dielectric pattern 210, an upper electrode layer 220, and an interlayer insulating layer 230.

A four-layer structure of TiN/Ti/Al/Ti layers 208, 206, 204, 202 is used for the lower electrode pattern 200. The TiN layer 208 is formed for preventing diffusion. The Ti layer 206 is formed for adhesion. The Al layer 204 has excellent electrical conductivity and is used as a base of a lower electrode layer. The Ti layer 202 functions as a barrier for preventing diffusion between a lower substrate (not shown) and the Al layer 204.

The dielectric pattern 210 is formed on the lower electrode pattern 200 and may comprise, for example, SiN, $Al_2O_3$, $Ta_2O_5$, TiO, $(Ba,Sr)TiO_3$, $Pb(Zr,Ti)O_3$, or $(Pb,La)(Zr,Ti)O_3$. In the present invention, SiN is used for the dielectric pattern 210.

The upper electrode layer 220 is formed on the dielectric layer 210 and includes a first upper electrode pattern 223 and a second upper electrode pattern 255.

The first upper electrode pattern 223 is formed on a predetermined area of the dielectric pattern 210 to improve adhesion between the dielectric pattern 210 and the second upper electrode pattern 255, and to lower contact resistance. In the present invention, a Ti or TiN layer is used for the first upper electrode pattern 223.

A trench portion 219 having a predetermined width is formed on the first upper electrode pattern 223 by an etching process belonging to a process of manufacturing the MIM capacitor 20.

A second upper electrode 255a is formed on the trench portion on the first upper electrode pattern 223 and functions as a base of the upper electrode layer 220.

The second upper electrode 255a may comprise, for example, aluminum (Al), platinum (Pt), ruthenium (Ru), iridium (Ir), or tungsten (W). In the present embodiment, tungsten (W) is used in consideration of the characteristics and coefficients of thermal expansion of materials to be formed above and below a conductive layer.

Barrier layers 240 and 250 for preventing diffusion may be further included between the first upper electrode pattern 223 and the second upper electrode 255a. It is preferable that the barrier layers 240 and 250 be formed using a single layer of Ti or TiN, or a double layer of a Ti layer contacting the first upper electrode pattern 223 and a TiN layer contacting the second upper electrode pattern 255.

The barrier layers 240 and 250 have a bottom portion that contacts the first upper electrode pattern 223 and sidewalls that contact the interlayer insulating layer 230 to be formed. When the barrier layers 240 and 250 are formed, the second upper electrode 255a is filled into an internal space formed by the bottom and the sidewalls of the barrier layers 240 and 250.

The interlayer insulating layer 230 is formed over the entire upper surface of the lower electrode pattern 200 and a structure formed on the lower electrode pattern 200. The interlayer insulating layer 230 has an opening pattern 235 that exposes an upper surface of the upper electrode layer 220 and on which the upper electrode layer 220 can be formed.

The opening pattern 235 is formed by an etching process. A structure including the first upper electrode pattern 223, the barrier layers 240 and 250, and the second upper electrode 255a is formed inside the opening pattern 235 of the interlayer insulating layer 230.

The interlayer insulating layer 230 is formed for insulation between internal metals. Here, the interlayer insulating layer 230 can be formed, for example, using Fluoride Silicate Glass (FSG), Phosphor Silicate Glass (PSG), silicon oxide ($SiO_x$), and other suitable insulative materials. Further, the interlayer insulating layer 230 can be formed, for example, using a chemical vapor deposition (CVD) method.

A via hole 260 that exposes the lower electrode pattern 200 may be further formed in the interlayer insulating layer 230.

The via hole 260 electrically connects an upper interconnect pattern 280 and the lower electrode pattern 200 to apply an operation voltage to the lower electrode pattern 200 and is filled with a metal.

Given that a process of filling the via hole 260 with a metal and a process of forming the second upper electrode 255a of the upper electrode layer 220 are simultaneously performed, a metal that is the same as the metal of the second upper electrode 255a of the upper electrode layer 220 is used as a metal filled into the via hole 260.

In other words, when the second upper electrode 255a of the upper electrode layer 220 is formed of tungsten, a via hole conductive layer 255b is also formed of tungsten (W).

Via hole barrier layers 263 and 265 formed using a single layer of Ti or TiN or a double layer of Ti/TiN may be interposed between the via hole conductive layer 255b and the interlayer insulating layer 230 and between the lower electrode pattern 200 and the interlayer insulating layer 230 to prevent diffusion and improve adhesion.

In greater detail, the via hole barrier layers 263 and 265 may be configured to have a double-layer structure in which a Ti layer contacts the lower electrode pattern 200 and the interlayer insulating layer 230, and a TiN layer contacts the via hole conductive layer 255b filled into the via hole 260. Alternatively, the via hole barrier layers 263 and 265 may have a single-layer structure of Ti or TiN.

An upper surface of the interlayer insulating layer 230 exposes the upper electrode layer 220 and the via hole conductive layer 255b, and the upper interconnect pattern 280 is formed on the interlayer insulating layer 230 to implement the MIM capacitor 20. A predetermined voltage is applied to the upper electrode layer 220 and the via hole conductive layer 255b.

The upper interconnect pattern 280 has a four-layer structure of TiN/Ti/Al/Ti layers 279, 277, 275, and 273. The topmost TiN layer 279 functions as an anti-reflection layer. The Ti layer 277 facilitates adhesion between the layers formed above and below the Ti layer 277 and prevents diffusion. The Al layer 275 has excellent electrical conductivity and functions as a base of an upper interconnect. The bottom-most Ti layer 273 contacting the upper electrode layer 220 and the via hole conductive layer 255b facilitates adhesion between the layers formed above and below the Ti layer 273 and prevents diffusion.

In the present invention as described above with reference to FIG. 2, the inside of the opening pattern 235 is not filled with Al to form the upper interconnect pattern 280, as is the case in the conventional approach described above. As a result, no stress is generated as a result of differences in the coefficient of thermal expansion between layers, as is the case in the conventional approach described above. Accordingly, generation of cracks is suppressed.

Figure 3:
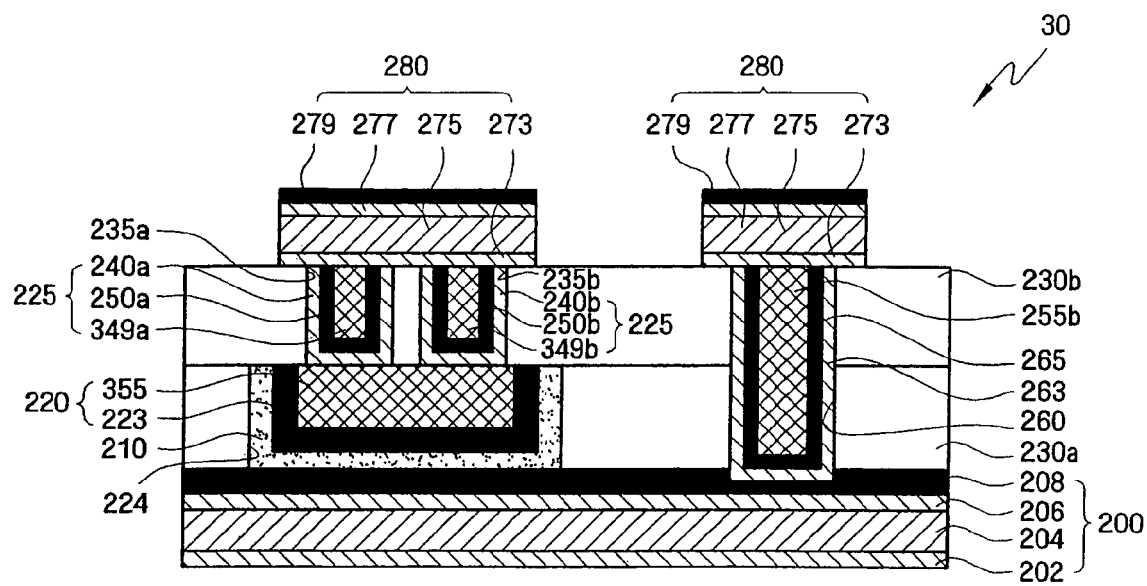
FIG. 3 is a cross sectional view of an MIM capacitor according to a second embodiment of the present invention.

FIG. 3 is a cross sectional view of an MIM capacitor according to a second embodiment of the present invention.

In FIGS. 2 and 3, like reference numerals refer to like elements.

An MIM capacitor 30 according to a second embodiment of the present invention includes a lower electrode pattern 200, a first interlayer insulating layer 230a, a dielectric layer 210, an upper electrode layer 220, a second interlayer insulating layer 230b, and an upper interconnect 280.

Hereinafter, only a difference between the MIM capacitor 20 according to the first embodiment of the present invention and the MIM capacitor 30 according to the second embodiment of the present invention and other points that are not explained in the above description will be described.

The first interlayer insulating layer 230a is formed on the lower electrode pattern 200 and its upper surface is planarized.

An opening pattern 224 that exposes the lower electrode pattern 200 is formed in the first interlayer insulating layer 230a.

The dielectric layer 210 is conformally formed along a profile of the opening pattern 224 within the opening pattern 224.

The upper electrode layer 220 is filled into the opening pattern 224 so that its upper surface can be substantially level with an upper surface of the first interlayer insulating layer 230a. The upper electrode layer 220 includes a first conductive layer 223 that is conformally formed along a profile of the dielectric layer 210 on the dielectric layer 210 and a second conductive layer 355 that is formed on the first conductive layer 223 and fills the opening pattern 224.

It is preferable that the first conductive layer 223 be a TiN layer and the second conductive layer 355 be formed of tungsten (W).

The second interlayer insulating layer 230b is formed on the first interlayer insulating layer 230a so that its upper surface can be planarized.

A via 225 is formed in the second interlayer insulating layer 230b to contact the upper electrode layer 220. In other words, the via 225 is formed in the second interlayer insulating layer 230b, and barrier layers 240a and 240b and 250a and 250b are conformally formed along the profiles of via holes 235a and 235b that expose the upper electrode layer 220. In this example, the via 225 comprises multiple vias.

Conductive layers 349a and 349b are formed on the barrier layers 240a and 240b and 250a and 250b so as to fill the via holes 235a and 235b, so that their upper surfaces can be substantially level with the second interlayer insulating layer 230b.

The barrier layers 240a and 240b and 250a and 250b are double layers of Ti/TiN and the conductive layers 235a and 235b are made of tungsten (W). The upper interconnect pattern 280 is formed on the second interlayer insulating layer 230b to contact the via 225.

Figure 4:
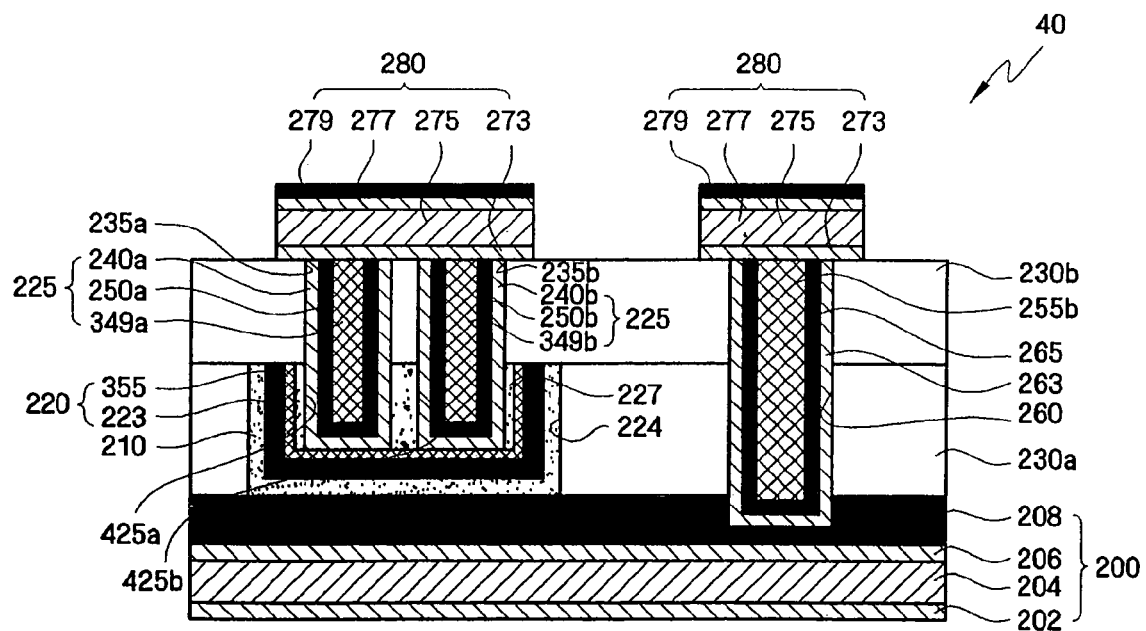
FIG. 4 is a cross sectional view of an MIM capacitor according to a third embodiment of the present invention.

FIG. 4 is a cross sectional view of an MIM capacitor according to a third embodiment of the present invention.

In FIGS. 3 and 4, like reference numerals refer to like elements.

As shown in FIG. 4, in an MIM capacitor 40 according to a third embodiment of the present invention, the structures of an opening pattern 224 and a via 225 are different from those in the MIM capacitor 30 according to the second embodiment of the present invention.

In other words, the opening pattern 224 includes the conformally formed dielectric layer 210 and the upper electrode layer 220 that fills the opening pattern 224 in the MIM capacitor 30 according to the second embodiment of the present invention, but the dielectric layer 210 and the upper electrode layer 220 are conformally formed in the opening pattern 224 and a filling insulating layer 227 fills the opening pattern 224 in the MIM capacitor 40 according to the third embodiment of the present invention.

The via 225 is formed to contact the upper electrode pattern 220 that is substantially level with the upper surface of the second interlayer insulating layer 230b in the MIM capacitor 30 according to the second embodiment of the present invention, but the via 225 is formed to contact the upper electrode pattern 220 through the first interlayer insulating layer 230a and the filling insulating layer 227 that fills the opening pattern 331 in the MIM capacitor 40 according to the second embodiment of the present invention. In this example, the via 225 comprises multiple vias.

Hereinafter, a method of fabricating an MIM capacitor according to the present invention will be described.

FIGS. 5A through 5E are cross sectional views of a method of fabricating an MIM capacitor according to a first embodiment of the present invention.

Figure 5A:
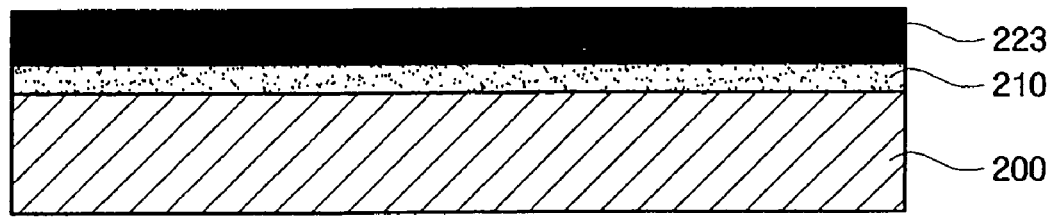
FIGS. 5A through 5F are cross sectional views of a method of fabricating an MIM capacitor according to a first embodiment of the present invention.

To fabricate the MIM capacitor 20 according to the first embodiment of the present invention, as shown in FIG. 5A, the dielectric layer 210 and the first upper electrode pattern 223 are sequentially formed on the lower electrode pattern 200 that is formed on a substrate and includes a conductive layer having a portion as a potential lower interconnect.

The dielectric layer 210 electrically insulates the lower electrode pattern 200 and an upper electrode layer (220 of FIG. 2) and allows a capacitor to store electric charges. The dielectric layer 210 is formed, for example, using a chemical vapor deposition (CVD) method and can comprise, for example, SiN, $Al_2O_3$, $Ta_2O_5$, TiO, $(Ba,Sr)TiO_3$, $Pb(Zr,Ti)O_3$, or $(Pb,La)(Zr,Ti)O_3$. In the present exemplary embodiment, SiN is used for the dielectric layer 210.

The first upper electrode pattern 223, which is one of the layers forming the upper electrode layer (220 of FIG. 2), is formed on the dielectric layer 210 to improve adhesion between the dielectric layer 210 and a conductive layer (255 of FIG. 2) and to reduce contact resistance. In the present embodiment, the contact layer (223 of FIG. 2) is formed of TiN using a CVD method.

Figure 5B:
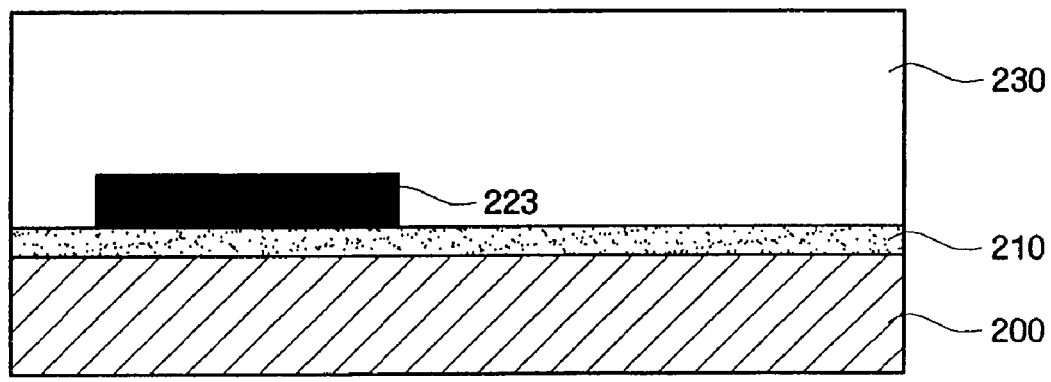

Next, as shown in FIG. 5B, a first upper electrode pattern is formed by performing a photo etching process on the first upper electrode pattern 223, and an interlayer insulating layer 230 is formed on the patterned first electrode layer 223 and the exposed dielectric layer 210.

In this step, the first upper electrode pattern 223 is patterned to remain in only a predetermined area of the dielectric layer 210 using a photo-etching process, and an upper surface of the dielectric layer 210 is exposed in the remaining area except for an area where the first upper electrode pattern 223 is formed.

The interlayer insulating layer 230 is formed on the first upper electrode pattern 223 remaining after removal and on the exposed dielectric layer 210.

The interlayer insulating layer 230 is formed for insulation between internal metals and may be formed of Fluoride Silicate Glass (FSG), Phosphor Silicate Glass (PSG), silicon oxide (SiOx), and so forth using a CVD method.

Figure 5C:
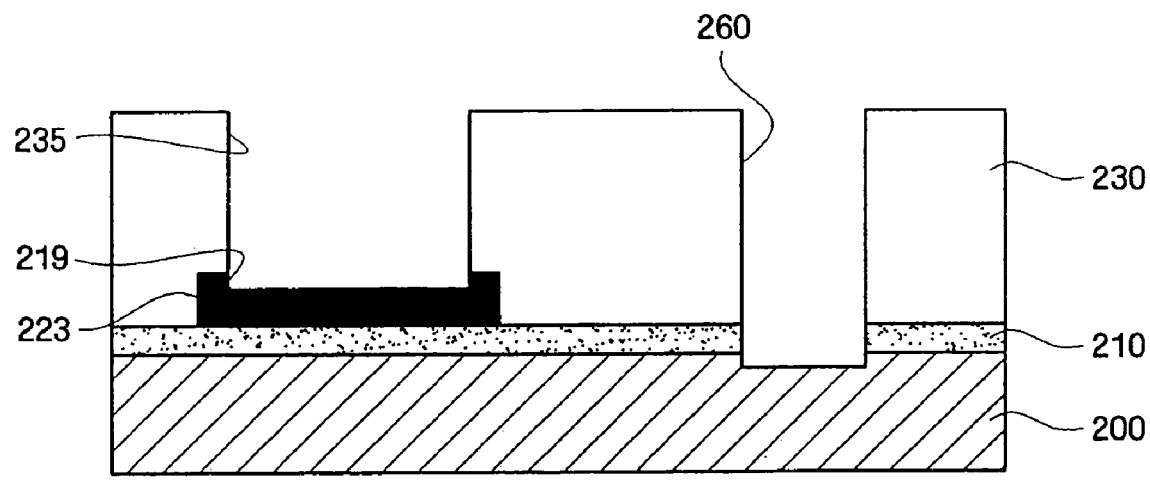

As shown in FIG. 5C, an opening pattern 235 that exposes a portion of the first upper electrode pattern 223 and a via hole 260 that exposes a lower electrode layer 200 are formed by etching the interlayer insulating layer 230.

The opening pattern 235 in which a second upper electrode layer (225 of FIG. 2) is to be formed is formed by etching the interlayer insulating layer 230. During etching of the interlayer insulating layer 230 for formation of the opening pattern 235, a trench portion 219 may be formed on the first upper electrode pattern 223 by etching a predetermined area of an upper surface of the first upper electrode pattern 223 to a predetermined depth.

The trench portion 219 is formed to increase the area contacting the first upper electrode pattern 223 and to improve adhesion when a metal material is filled into the opening pattern 235.

The via hole 260 electrically exposes the lower electrode layer 200 and is later filled with a metal, thereby allowing an operating voltage to be applied to the lower electrode layer 200.

Figure 5D:
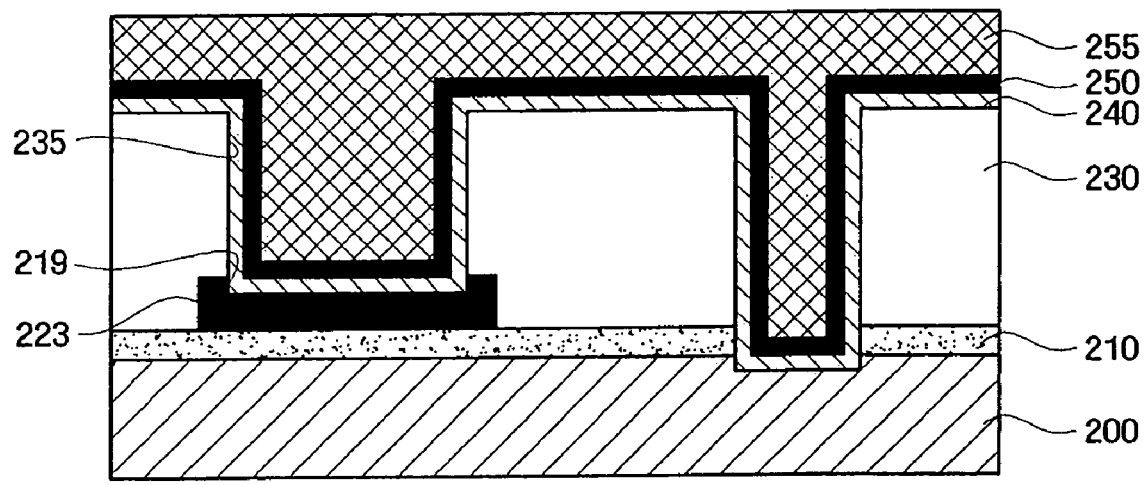

Next, as shown in FIGS. 5C and 5D, barrier layers 240 and 250 are conformally formed on the interlayer insulating layer 230, the opening pattern 235, and the via hole 260, and a conductive layer 255 is formed of a metal material on the barrier layers 240 and 250 to fill the opening pattern 235 and the via hole 260.

The barrier layers 240 and 250 are diffusion barriers for preventing diffusion between materials formed above and below the barrier layers 240 and 250. The barrier layers 240 and 250 may comprise a double layer of a Ti layer 240 contacting the first upper electrode pattern 223 and a TiN layer 250 contacting the conductive layer 255 or a single layer of Ti or TiN.

The conductive layer 255 functions as a base of the upper electrode layer (220 of FIG. 2) and is coated on the barrier layers 240 and 250 to fill the opening pattern 235 and the via hole 260.

The conductive layer 255 may be formed of aluminum (Al), platinum (Pt), ruthenium (Ru), iridium (Ir), or tungsten (W). In the present exemplary embodiment, tungsten (W) is used in consideration of characteristics and coefficients of thermal expansion of materials to be formed above and below a conductive layer.

Figure 5E:
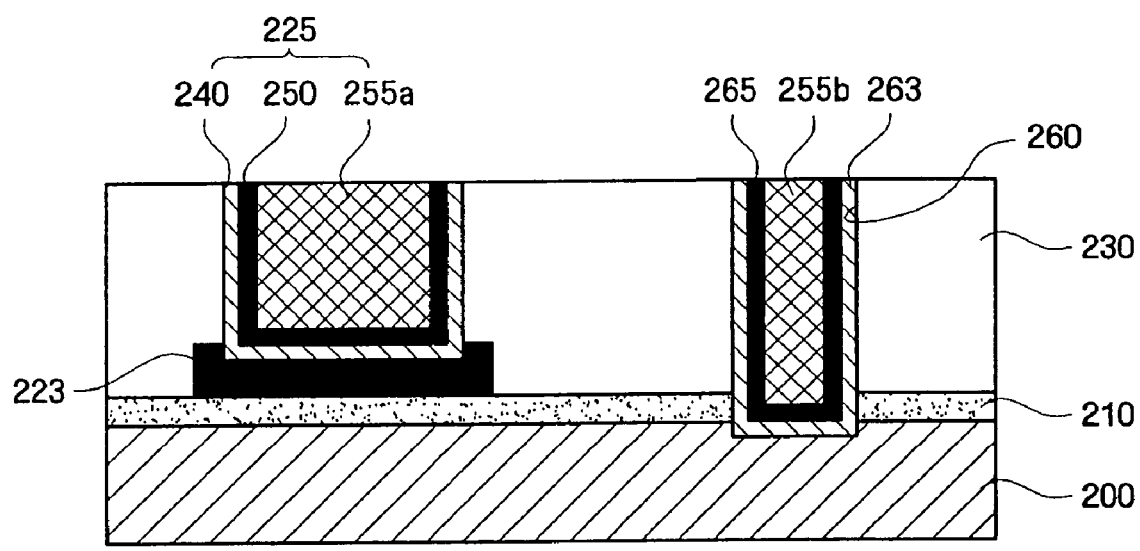

Next, as shown in FIG. 5E, the conductive layer 255 and the barrier layers 240 and 250 on the interlayer insulating layer 230, the opening pattern 235, and the via hole 260 are partially removed through a planarization process.

In other words, planarization is performed until an upper surface of the interlayer insulating layer 230 is exposed by a chemical mechanical polishing (CMP) process.

As a result, the conductive layer 255 and the barrier layer 240 on the interlayer insulating layer 230, the opening pattern 235, and the via hole 260 are removed, and the conductive layer 255a in the opening pattern 235 and the conductive layer 255b in the via hole 260 are electrically insulated and separated from each other.

The barrier layers 240 and 250 in the opening pattern 235 and the barrier layers 263 and 265 in the via hole 260 are also separated and insulated from each other.

Figure 5F:
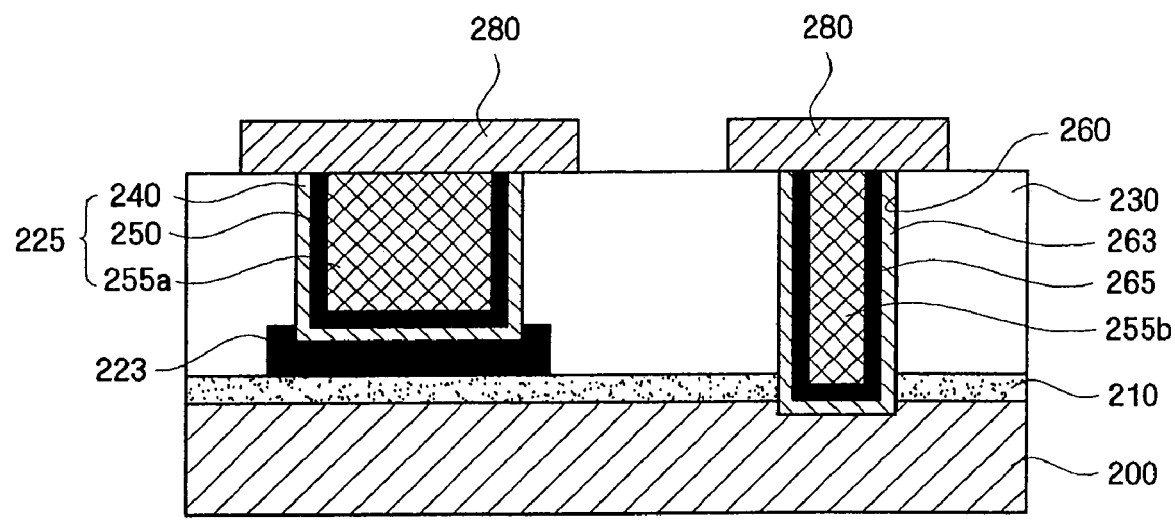

As show in FIG. 5F, an upper interconnect 280 that contacts the upper electrode 225, the via hole 260, and the metal layer 255b is formed on the second interlayer insulating layer 230b.

FIGS. 6A through 6F are cross sectional views for explaining a method of fabricating an MIM capacitor according to a second embodiment of the present invention.

In FIGS. 6A through 6F, FIG. 3, and FIGS. 5A through 5E, like reference numerals refer to like elements.

Figure 6A:
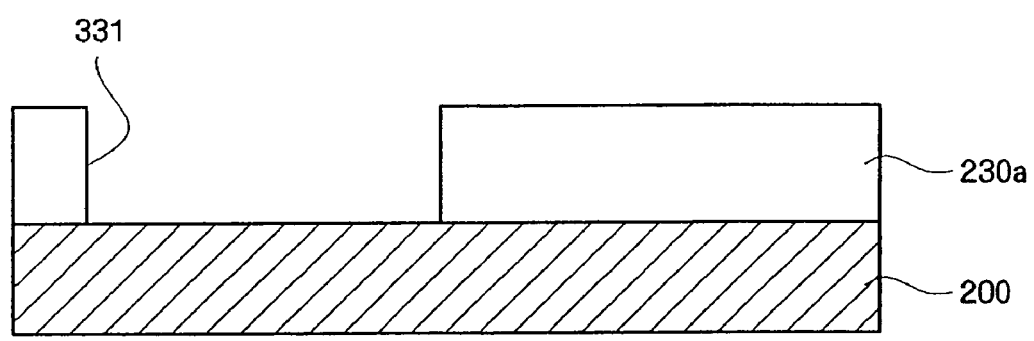
FIGS. 6A through 6G are cross sectional views of a method of fabricating an MIM capacitor according to a second embodiment of the present invention.

To fabricate the MIM capacitor 30 according to the second embodiment of the present invention, as shown in FIG. 6A, the first interlayer insulating layer 230a is formed on the lower electrode pattern 200 that is formed on a substrate and includes a conductive layer having a portion as a potential lower interconnect. A predetermined area of the first interlayer insulating layer 230a is etched to expose the lower electrode layer 200, thereby forming the opening pattern 331.

Figure 6B:
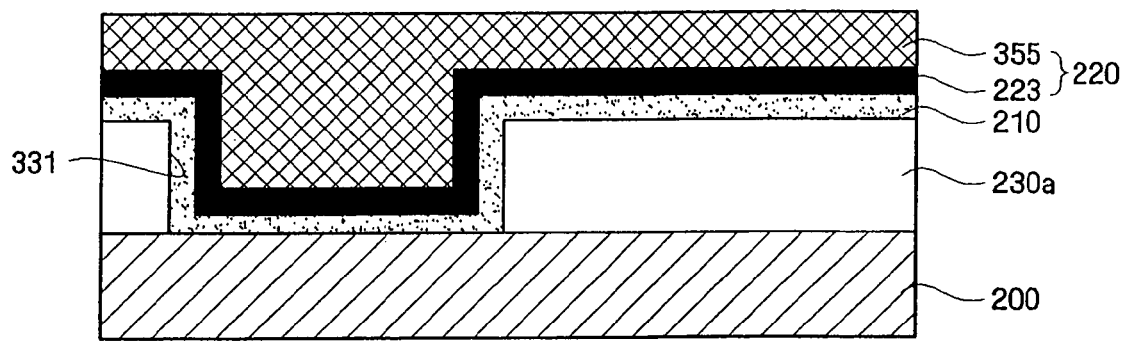

Next, as shown in FIG. 6B, the dielectric layer 210 and the first conductive layer 223 are conformally formed on the first interlayer insulating layer 230a and the opening pattern 331, and the second conductive layer 355 is formed of a metal material on the first conductive layer 223 to fill the opening pattern 331.

At this time, the first conductive layer 223 and the second conductive layer 355 form the upper electrode layer 220 of the MIM capacitor 30 according to the second embodiment of the present invention.

Figure 6C:
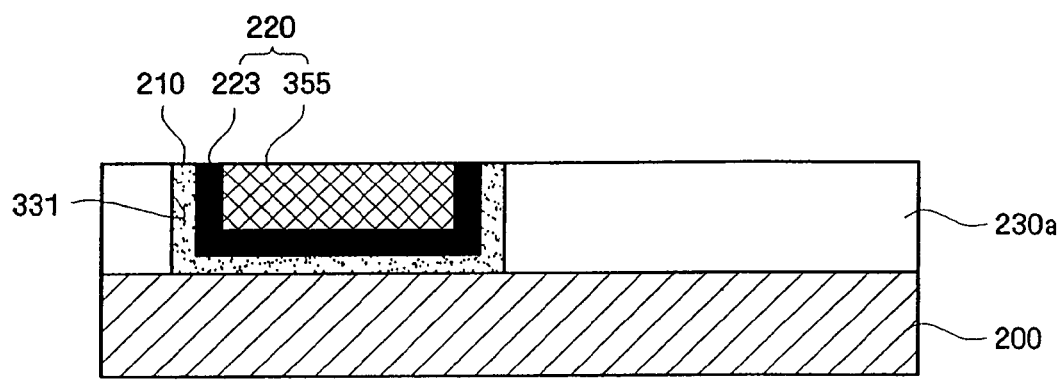

As shown in FIG. 6C, the second conductive layer 355, the first conductive layer 223, the dielectric layer 210 on the first interlayer insulating layer 230a, and the opening pattern 331 are partially removed through a planarization process using CMP. Thus, the upper electrode layer 220 is made to be substantially level with the first interlayer insulating layer 230a.

Figure 6D:
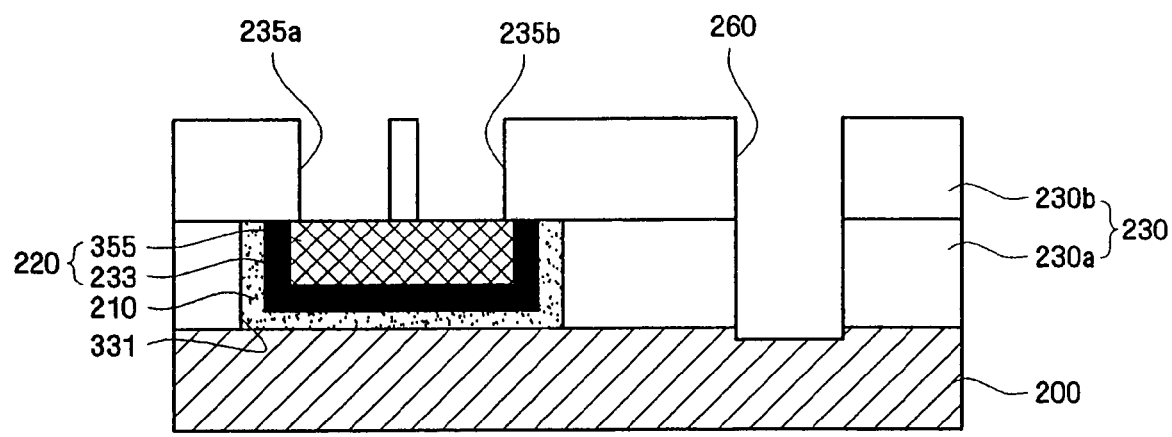

Next, as shown in FIG. 6D, after the second interlayer insulating layer 230b is formed on the exposed first interlayer insulating layer 230a, the dielectric layer 210 that fills the opening pattern 331, and the upper electrode layer 220, the via holes 235a and 235b are formed to expose the second conductive layer 355 by etching the second interlayer insulating layer 230b. The via hole 260 is formed to expose the lower electrode layer 200 by etching the second interlayer insulating layer 230b and the first interlayer insulating layer 230a.

Here, it is preferable that the via holes 235a and 235b be formed to expose a surface of the second conductive layer 355 and to not overlap with each other.

The via hole 260 is formed to electrically connect the lower electrode pattern 200 with an upper electrode interconnect.

Figure 6E:
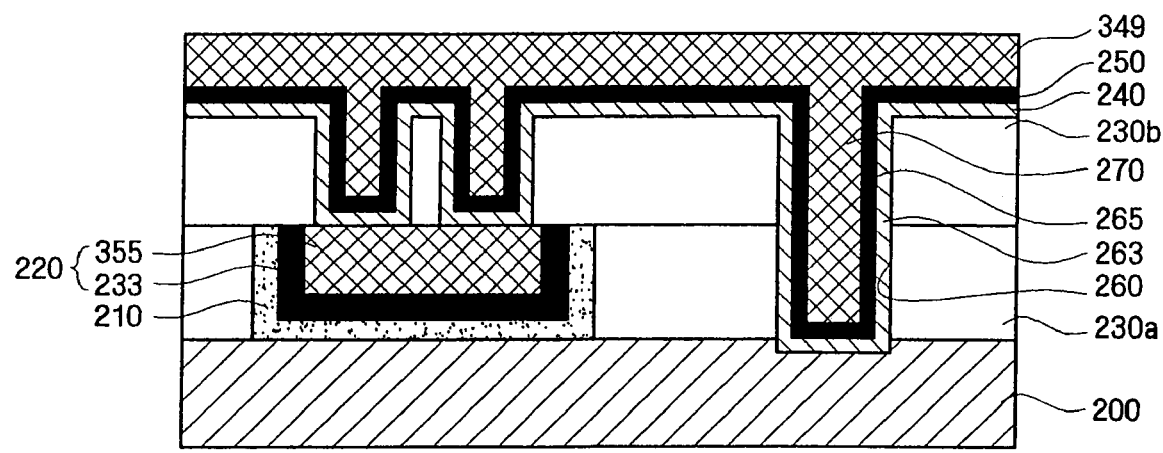

Next, as shown in FIG. 6E, the barrier layers 240 and 250 are conformally formed on the second interlayer insulating layer 230b, the via holes 235a and 235b, and the via hole 260 to prevent diffusion and facilitate adhesion. The conductive layer 349 is formed of a metal material on the barrier layers 240 and 250 to fill the via holes 235a and 235b.

Figure 6F:
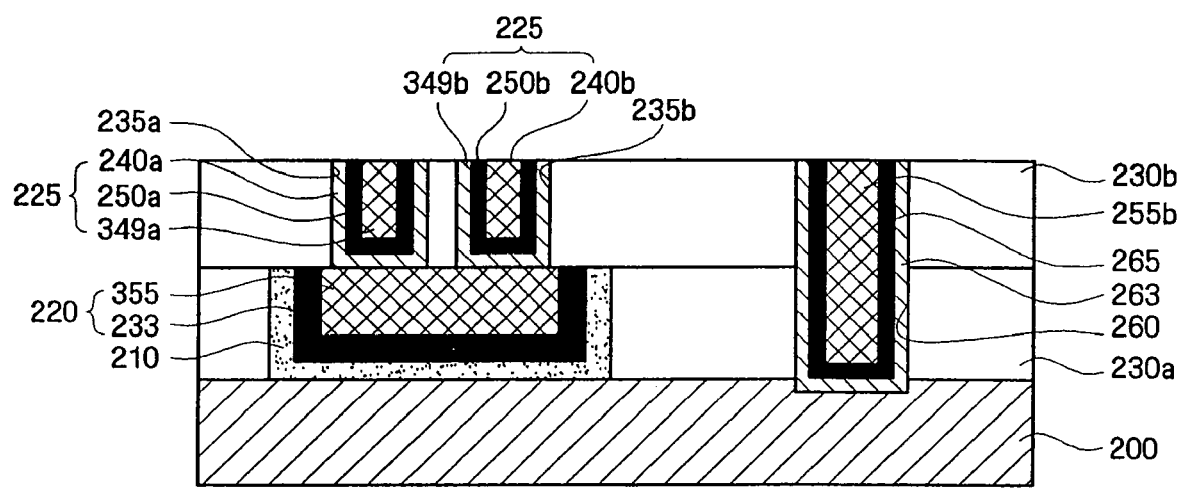
Figure 6G:
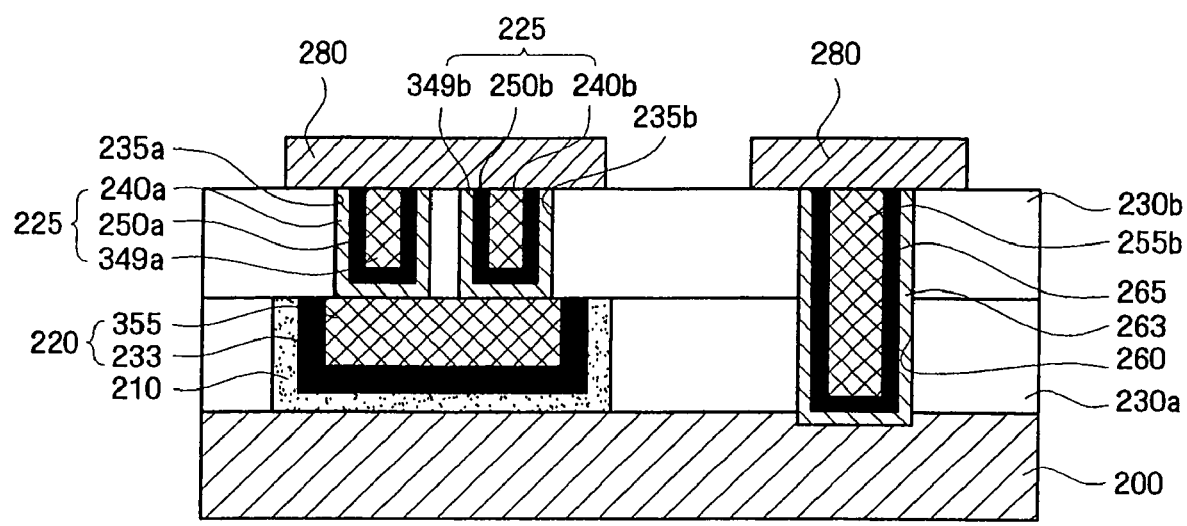

Next, as shown in FIG. 6F, the conductive layer 349 and the barrier layers 240 and 250 on the second interlayer insulating layer 230b, the via holes 235a and 235b, and the via hole 260 are partially removed using a planarization process. As a result of the removal, the via 349a filled into the via holes 235a and 235b and the metal layer 255b filled into the via hole 260 are electrically separated. In addition, as a result of the removal, the barrier layers 240 and 250 are also separated into the barrier layers 240a, 240b, 250a, and 250b formed in the via holes 235a and 235b and the barrier layers 263 and 265 formed in the via hole 260. Finally, as shown in FIG. 6G, the upper interconnect 280 is formed on the second interlayer insulating layer 230b and contacts the vias 225, the via hole 260, and the metal layer 255b.

FIGS. 7A through 7F are cross sectional views for explaining a method of fabricating an MIM capacitor according to a third embodiment of the present invention.

In FIGS. 7A through 7F, FIG. 4, and FIGS. 5A through 5E, like reference numerals refer to like elements.

Figure 7A:
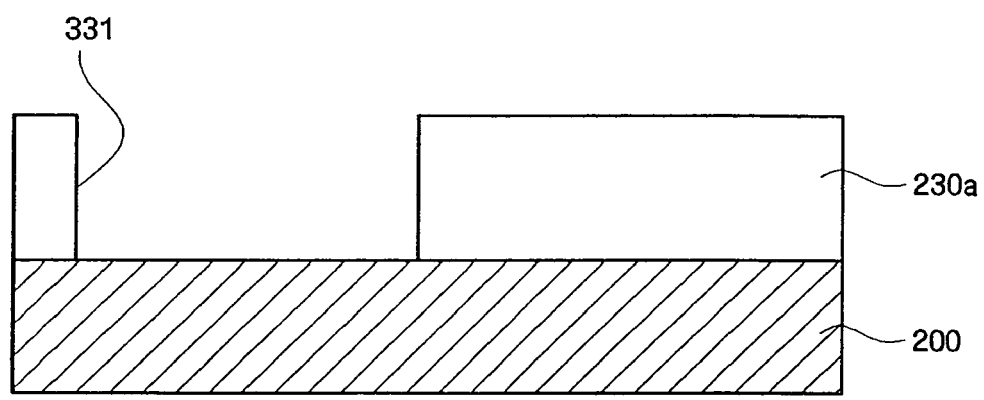
FIGS. 7A through 7H are cross sectional views of a method of fabricating an MIM capacitor according to a third embodiment of the present invention.

To fabricate the MIM capacitor 40 according to the third embodiment of the present invention, as shown in FIG. 7A, the first interlayer insulating layer 230a is formed on the lower electrode pattern 200 that is formed on a substrate and includes a conductive layer having a portion as a potential lower interconnect, and the opening pattern 331 is formed by etching a predetermined area of the first interlayer insulating layer 230a to expose the lower electrode layer 200.

Figure 7B:
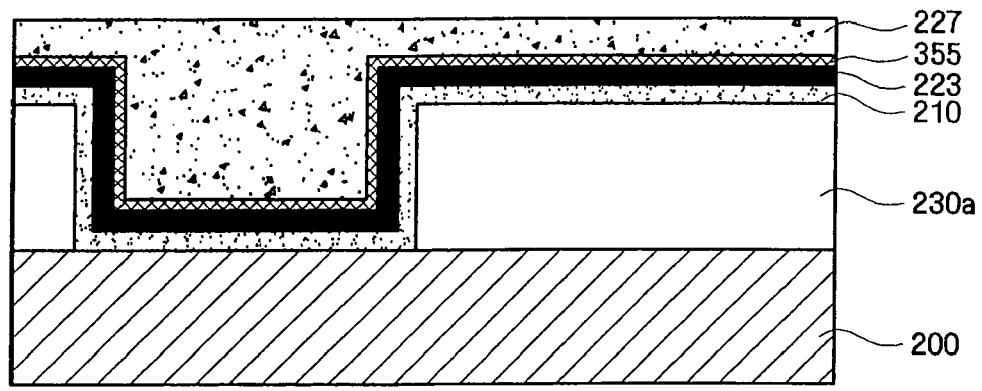

Next, as shown in FIG. 7B, the dielectric layer 210, the first conductive layer 223, and the second conductive layer 355 are conformally formed on the first interlayer insulating layer 230a and the opening pattern 331.

The filling insulating layer 227 is formed of a metal material on the second conductive layer 223 to fill the opening pattern 331. The first conductive layer 223 and the second conductive layer 355 form the upper electrode layer 220 of the MIM capacitor 40 according to the third embodiment of the present invention.

Figure 7C:
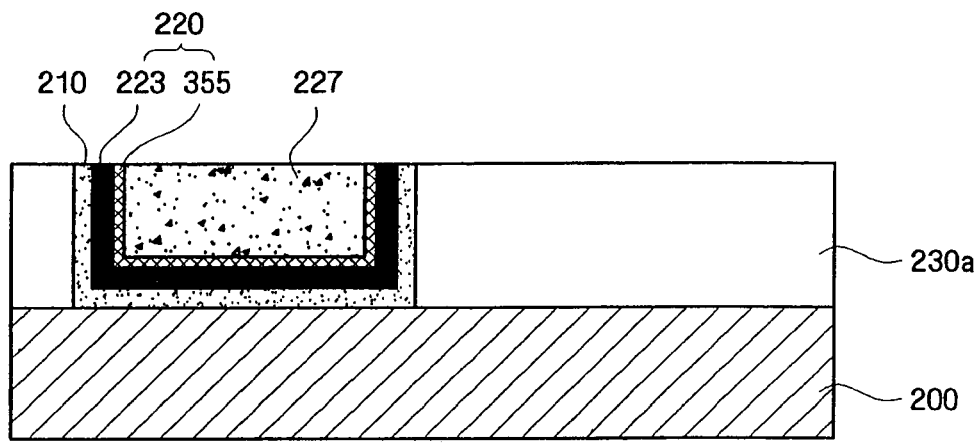

Next, as shown in FIG. 7C, the filling insulating layer 227 is made to be substantially level with the first interlayer insulating layer 230a by partially removing the filling insulating layer 227, the second conductive layer 355, and the first conductive layer 223 on the first interlayer insulating layer 230a through a planarization process, for example using CMP.

Figure 7D:
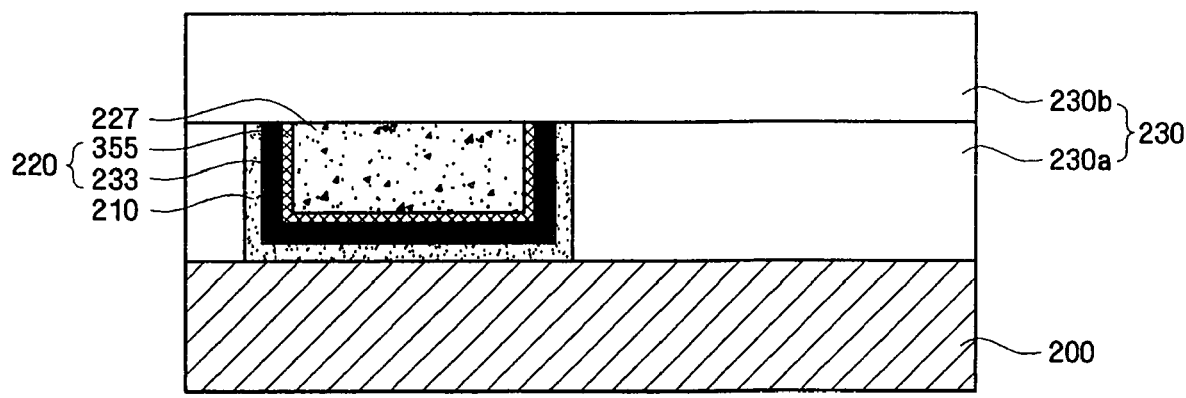

As shown in FIG. 7D, the second interlayer insulating layer 230b is formed on the exposed first interlayer insulating layer 230a.

Figure 7E:
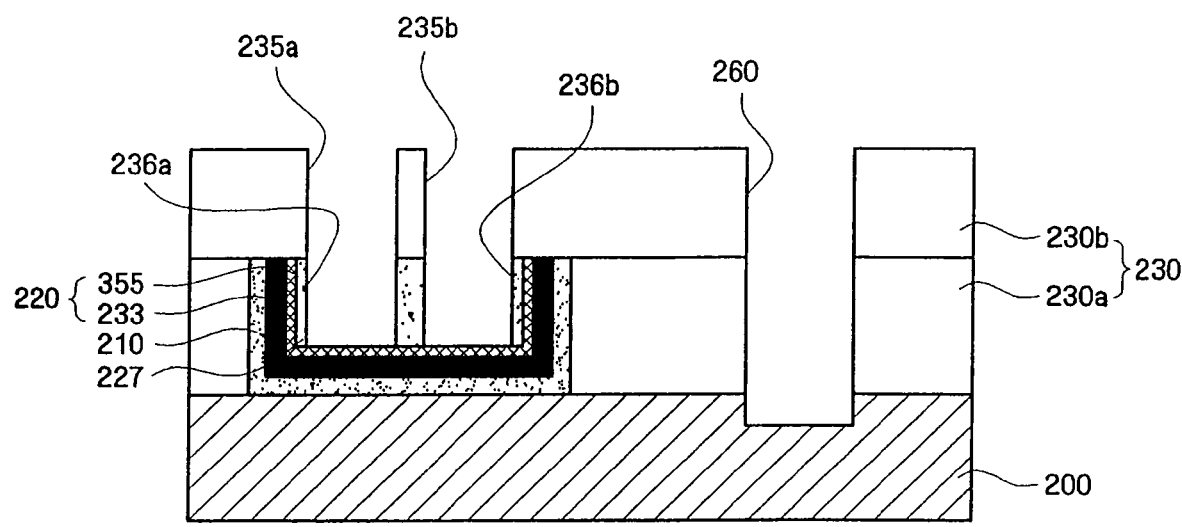

Next, as shown in FIG. 7E, the via holes 235a and 235b are formed to expose an upper surface of the upper electrode layer 220 by etching the second interlayer insulating layer 230b and the filling insulating layer 227. The via hole 260 is formed to expose the lower electrode 200 by etching the second interlayer insulating layer 230b and the first interlayer insulating layer 230a.

Figure 7F:
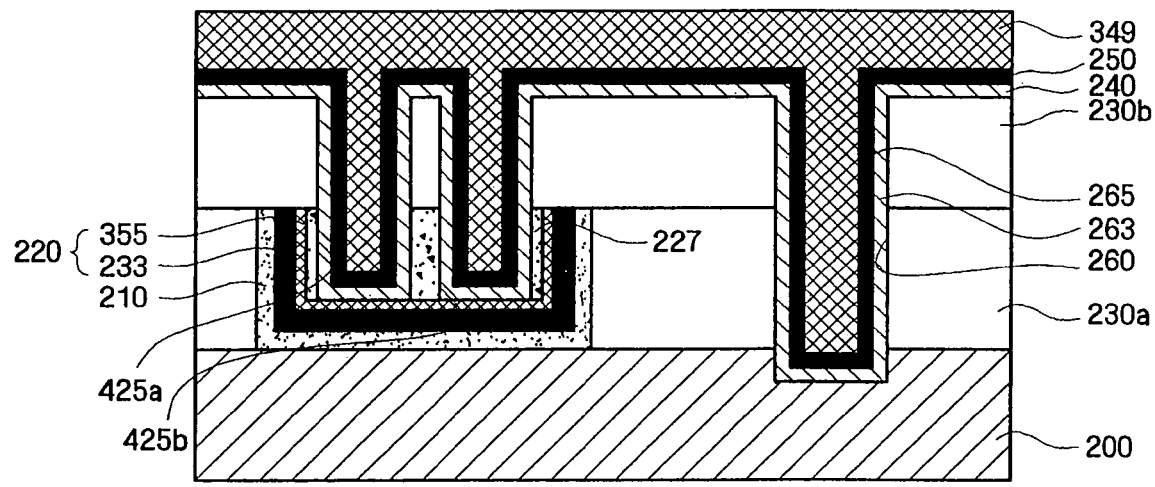

As shown in FIG. 7F, the barrier layers 240 and 250 are conformally formed on the second interlayer insulating layer 230b, the via holes 235a and 235b, and the via hole 260 to prevent diffusion and facilitate adhesion. The conductive layer 349 is formed of a metal material on the barrier layers 240 and 250 to fill the via holes 235a and 235b and the via hole 260.

Figure 7G:
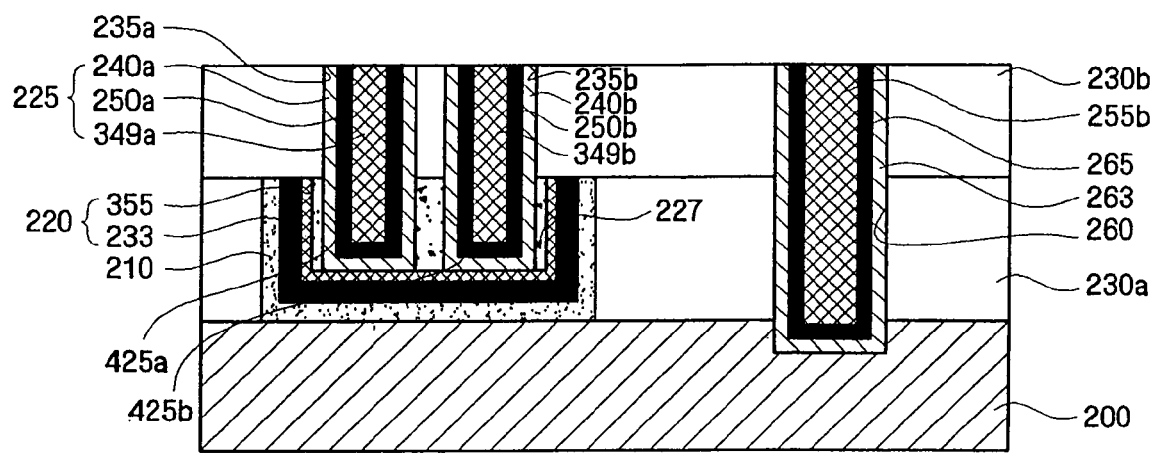

Next, as shown in FIG. 7G, the conductive layer 349 and the barrier layers 240 and 250 on the second interlayer insulating layer 230b, the via holes 235a and 235b, and the via hole 260 are partially removed through a planarization process.

As a result, the via 225 filled into the via holes 235a and 235b and the metal layer 255b filled into the via hole 260 are formed to be electrically separated.

As a result of the removal, the barrier layers 240 and 250 are also separated into the barrier layers 240a and 250a formed in the via hole 235a, the barrier layers 240b and 250b formed in the via hole 235b, and the barrier layers 263 and 265 formed in the via hole 260.

Figure 7H:
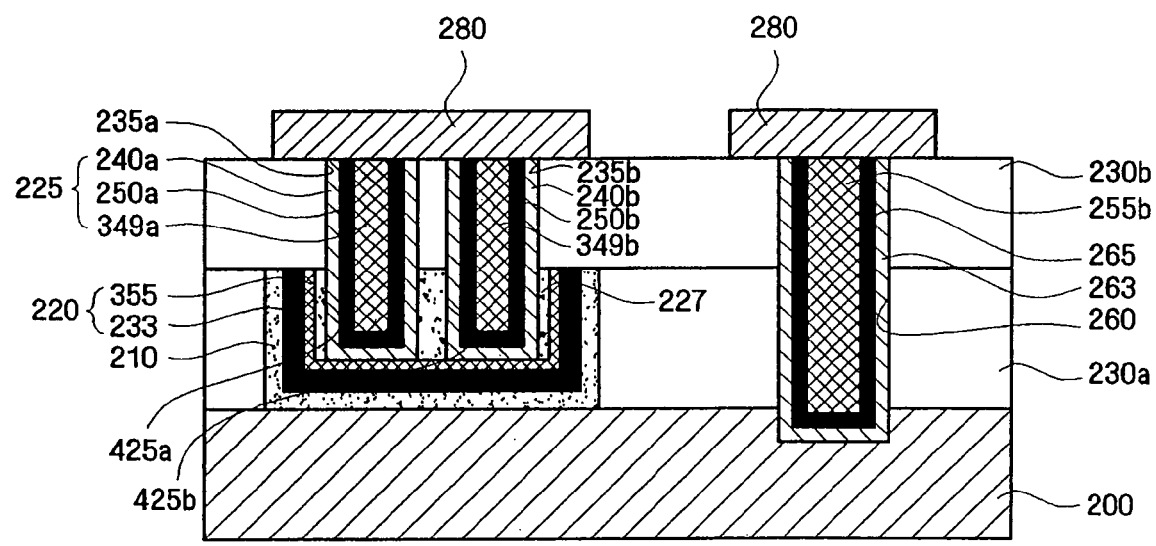

Finally, as shown in FIG. 7H, the upper interconnect 280 that contacts the via 225, the via hole 260, and the metal layer 255b is formed on the second interlayer insulating layer 230b.

As described above, according to the present invention, the generation of a crack in a dielectric layer is prevented, thereby increasing the total fabricating yield of MIM capacitors.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A metal-insulator-metal (MIM) capacitor comprising:
   a lower electrode pattern which is formed on a substrate and includes a conductive layer having a portion as a lower interconnect;
   a dielectric layer on the lower electrode pattern;
   a first upper electrode pattern on the dielectric layer;
   an interlayer insulating layer which covers the first upper electrode pattern, the dielectric layer, and the lower electrode pattern and has a planarized upper surface;

a second upper electrode opening pattern formed in the interlayer insulating layer to expose the first upper electrode pattern;

a second upper electrode which fills the opening pattern and has an upper surface that is substantially level with an upper surface of the interlayer insulating layer, wherein the second upper electrode comprises a barrier layer which is conformally formed along inner sidewalls and a bottom of the second upper electrode opening pattern and a conductive layer which is formed on the barrier layer to fill the second upper electrode opening pattern, wherein the barrier layer comprises a single layer of Ti or TiN or a double layer of Ti and TiN layers, and the conductive layer comprises tungsten (W); and an upper interconnect on the interlayer insulating layer and contacts the second upper electrode, wherein the upper interconnect comprises aluminum.

2. The MIM capacitor of claim 1, wherein the second upper electrode opening pattern exposes a portion of, or the entire, first upper electrode pattern.

3. The MIM capacitor of claim 1, wherein the first upper electrode pattern comprises a Ti or TiN layer.

* * * * *